(12) United States Patent
Shiozaki et al.

(10) Patent No.: US 6,963,120 B2
(45) Date of Patent: Nov. 8, 2005

(54) PHOTOVOLTAIC ELEMENT

(75) Inventors: Atsushi Shiozaki, Kyoto (JP); Shuichiro Sugiyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/704,642

(22) Filed: Nov. 12, 2003

(65) Prior Publication Data

US 2004/0149988 A1 Aug. 5, 2004

(30) Foreign Application Priority Data

Nov. 13, 2002 (JP) ........................................ 2002-328970

(51) Int. Cl.$^7$ ............................................ H01L 31/075
(52) U.S. Cl. ..................... 257/458; 257/464; 257/53; 136/258
(58) Field of Search ...................... 257/458, 53, 464; 136/258

(56) References Cited

U.S. PATENT DOCUMENTS

| | | | |
|---|---|---|---|
| 5,047,090 A | * 9/1991 | Hayashi et al. | ............. 136/249 |
| 5,298,086 A | 3/1994 | Guha et al. | .................. 136/249 |
| 6,132,569 A | 10/2000 | Shiozaki | ................ 204/192.27 |
| 6,153,823 A | 11/2000 | Shiozaki et al. | ............. 136/249 |
| 6,337,224 B1 | 1/2002 | Okamoto et al. | ............. 438/69 |
| 6,399,873 B1 | 6/2002 | Sano et al. | .................. 136/249 |
| 6,472,248 B2 | 10/2002 | Shiozaki et al. | ............... 438/97 |
| 6,483,021 B2 | 11/2002 | Saito | ........................... 136/258 |
| 6,531,654 B2 | 3/2003 | Sugiyama et al. | ........... 136/258 |
| 2003/0104664 A1 | 6/2003 | Kondo et al. | ................ 438/200 |

FOREIGN PATENT DOCUMENTS

| | | |
|---|---|---|
| JP | 8-139347 | 5/1996 |
| JP | 11-243218 | 9/1999 |
| JP | 11-243219 | 9/1999 |
| JP | 11-330520 | 11/1999 |

OTHER PUBLICATIONS

W.E. Spear, et al., "Substitutional Doping of Amorphous Silicon", Solid State Communications, vol. 17, (1975), pp. 1193–1196.

J. Yang, et al., "Triple–junction amorphous silicon alloy solar cell with 14.6% initial and 13.0% stable conversion efficiencies", Appl. Phys. Lett., vol. 70, No. 22, (1997), pp. 2975–2977.

J. Meier, et al., "On the Way Towards High Efficiency Thin Film Silicon Solar Cells By The 'Micromorph' Concept", Amorphous Silicon Technology, Mat. Res. Soc. Symp. Proc., vol. 420, (1996), pp. 3–14.

K. Yamamoto, et al., "Below 5 µm Thin Film Poly–Si Solar Cell on Glass Substrate Fabricated at Low Temperature", 2nd World Conference and Exhibition on Photovoltaic Solar Energy Conversion, Jul. 6–10, 1998, Vienna, Austria, Crystalline Silicon Solar Cells and Technologies, pp. 1284–1289.

* cited by examiner

Primary Examiner—Jerome Jackson
(74) Attorney, Agent, or Firm—Fitzpatrick, Cella, Harper and Scinto

(57) ABSTRACT

A photovoltaic element is provided which has a high conversion efficiency, a low-cost producibility, a light weight and good overall characteristics in a final product form with a transparent protective member. The photovoltaic element comprises a first pin junction comprising an i-type amorphous semiconductor, a second pin junction comprising an i-type microcrystalline semiconductor, and a third pin junction comprising an i-type microcrystalline semiconductor provided in the mentioned order from a light incidence side, wherein at least a transparent protective member and a transparent electrode layer are provided on the light incidence side of the first pin junction, and wherein of the photocurrents generated at the plurality of pin junctions, the photocurrent generated at the third pin junction is the smallest.

5 Claims, 2 Drawing Sheets

PHOTOVOLTAIC ELEMENT

BACKGROUND OF THE INVENTION

1. Field of the Invention

The present invention relates to a photovoltaic element such as a solar cell or a sensor having a plurality of pin junctions for improving the conversion efficiency and covered with a protective member in consideration of long-term outdoor use.

2. Related Background Art

Various photovoltaic elements have already been put to use as independent power supplies for electric appliances and as an alternative to electric power systems. At the present time, however, their prices for a unit amount of generated power when they are used as an alternative to electric power systems are still high and studies and development of them are vigorously promoted.

Thin-film photovoltaic elements have attracted attention since structure sensitivity of amorphous silicon thin film such as that of crystalline silicon under doping by substitution was reported (see W. E. Spear, P. G. Lecomber "Solid State Commun." Vol. 17, p. 1193, 1975). Studies of thin-film photovoltaic elements, e.g., the one described in U.S. Pat. No. 5,298,086 have been vigorously made.

In recent years, the photoelectric conversion efficiency of thin-film photovoltaic elements has reached 13%, as reported in J. Yang, A. Banerjee, S. Guha "Appl. Phys. Lett." Vol. 70, No. 22, p. 2 and p. 2975, 1997.

Also, on microcrystalline silicon studied and developed in the past but left behind crystalline silicon and amorphous silicon in being put to practical use, studies have been vigorously made since it was reported that a satisfactorily high degree of photoelectric conversion efficiency can be obtained by using microcrystalline silicon, and that no photodegradation of microcrystalline silicon is observed (see J. Meier, P. Torres, R. Platz, H. Keppner, A. Shah "Mat. Res. Soc. Symp. Proc." Vol. 420, p. 3, 1996).

Photovoltaic elements having a photoelectric conversion efficiency of 10.7% have recently been reported (see Japanese Patent Application Laid-Open No. H11-330520 and K. Yamamoto, A. Nakajima, Y. Tawada, M. Yoshimi, Y. Okamoto, S. Igari "Pro. Of $2^{nd}$ World Con. Photovoltaic Energy Conversion" p. 1284, 1998, for example).

Schemes to further improve the efficiency by stacking a plurality of pairs of a pin junction mainly formed of an amorphous semiconductor and a pin junction mainly formed of a microcrystalline semiconductor have also been put forth (see Japanese Patent Application Laid-Open Nos. H11-243218 and H11-243219, for example).

In U.S. Pat. No. 5,298,086 is described an arrangement in which the photocurrent through a pin junction of the best characteristics is made the smallest of the photocurrents through a plurality of pin junctions.

In U.S. Pat. No. 6,153,823 is described an arrangement in which the photocurrent through a pin junction having a smaller degradation rate after the provision of a protective member is made smallest.

Further, in Japanese Patent Application Laid-Open No. H11-243219 is described a technique of making smallest the photocurrent generated at a pin junction comprising an i-type microcrystalline semiconductor in a photovoltaic element having a stack of a pin junction comprising an i-type amorphous semiconductor and a pin junction comprising an i-type microcrystalline semiconductor.

From these findings based on the studies heretofore made, it is easily conceivable that in the case of fabrication of a photovoltaic element in which a first pin junction comprising an i-type amorphous semiconductor, a second pin junction comprising an i-type microcrystalline semiconductor and a third pin junction comprising i-type microcrystalline semiconductor are formed in this order from the light incidence side, the second pin junction on the light incidence side of the second and third pin junctions may be ordinarily set thinner than the third pin junctions, low transportability of carriers excited by light may suffice, and the photocurrent generated at the second pin junction is made smallest.

Apart from these techniques, a technique of providing a layer functioning both as an antireflection layer and as an electrode on the light incidence side of a pin junction to effectively utilize light is also known.

There is a demand for designing a solar cell so that the solar cell is capable of long-term outdoor use. Light and flexible protective members other than glass protective members ordinarily used have also been proposed. An example of such protective members is one having a transparent fluoride polymer thin film such as a fluororesin film formed as an outermost surface layer and some of various thermoplastic, transparent, organic resins, e.g., an acrylic resin used as an encapsulant resin on the photovoltaic element side of the outermost layer (see Japanese Patent Application Laid-Open No. H08-139347). It is generally known that this kind of protective member can also have an antireflection effect if the refractive index of the protective member is set to a value between the refractive index of a transparent resistive layer and the refractive index of air.

While techniques such as those described above are being studied, it is most important, from the standpoint of use of photovoltaic elements, to determine whether the totality of the amount of material used, the cost of fabrication, the installation area, the external appearance, etc., of a photovoltaic element is commensurate with the generated energy obtained during a long period of ten to twenty years. That is, only the efficiency of conversion from light to electricity is not always the most important. This also explains the reason that thin film photovoltaic elements having the potential to be fabricated at a much lower price while being slightly inferior in conversion efficiency in comparison with crystalline photovoltaic elements having a high conversion efficiency attract attention.

Photovoltaic elements have been improved by the above-described techniques but their prices for a unit amount of generated power when they are used as an alternative to electric power systems are still high. There is a demand for a higher photoelectric conversion efficiency and for a method for fabrication at a low cost.

SUMMARY OF THE INVENTION

It is, therefore, an object of the present invention to provide a constitution most suitable for a photovoltaic element having a high conversion efficiency, a low-cost producibility, a light weight and good overall characteristics even in a final product form including a transparent protective member.

It is another object of the present invention to provide a photovoltaic element capable of maintaining the conversion efficiency generally constantly even during long-term use.

According to a first aspect of the present invention, there is provided a photovoltaic element comprising a first pin junction comprising an i-type amorphous semiconductor, a second pin junction comprising an i-type microcrystalline semiconductor, and a third pin junction comprising an i-type microcrystalline semiconductor provided in the mentioned order from a light incidence side, wherein at least a transparent protective member and a transparent electrode layer are provided on the light incidence side of the first pin junction, and wherein of the photocurrents generated at the plurality of pin junctions, the photocurrent generated at the third pin junction is the smallest.

In this aspect, for obtaining the desired result, it is preferred that the open-circuit voltage of the first pin junction comprising the i-type amorphous semiconductor is within the range from 0.8 V to 1.1 V; the open-circuit voltages of the second and the third pin junctions comprising the microcrystalline semiconductors are within the range from 0.4 V to 0.6 V; and the thickness of the i-type layer of the second pin junction comprising the i-type microcrystalline semiconductor is greater than 1.0 $\mu$m, and more preferably greater than 1.5 $\mu$m.

Further, it is preferable that before the transparent protective member is provided, the photocurrent generated at the first pin junction comprising the i-type amorphous semiconductor is the largest and the photocurrent generated at the second pin junction comprising the i-type microcrystalline semiconductor is the second largest.

According to a second aspect of the present invention, there is provided a photovoltaic element comprising a transparent protective member and a transparent electrode layer successively provided from a light incidence side, and a plurality of pin junctions provided subsequently to the transparent electrode layer, wherein of the photocurrents generated at the plurality of pin junctions, the photocurrent generated at such pin junction as to show the largest photocurrent increase by the provision of the transparent protective member is the smallest.

According to a third aspect of the present invention, there is provided a photovoltaic element comprising a transparent protective member and a transparent electrode layer successively provided from a light incidence side, at least one pin junction comprising an i-type amorphous semiconductor provided subsequently to the electrode layer, and at least two pin junctions comprising i-type microcrystalline semiconductors provided subsequently to the pin junction comprising the i-type amorphous semiconductor, wherein of the photocurrents generated at the plurality of pin junctions, the photocurrent generated at the pin junction comprising the i-type microcrystalline semiconductor that is closest to the light incidence side (i.e., located at the light-incidence-sidemost position) is not the smallest and the photocurrent generated at one of the other pin junctions comprising the i-type microcrystalline semiconductors is the smallest.

In this aspect, it is preferable that before the transparent protective member is provided, the photocurrent generated at each of the pin junctions comprising the i-type amorphous semiconductors is larger than the photocurrent generated at the pin junction comprising the i-type microcrystalline semiconductor closest to the light incidence side.

DESCRIPTION OF THE PREFERRED EMBODIMENTS

Figure 1:
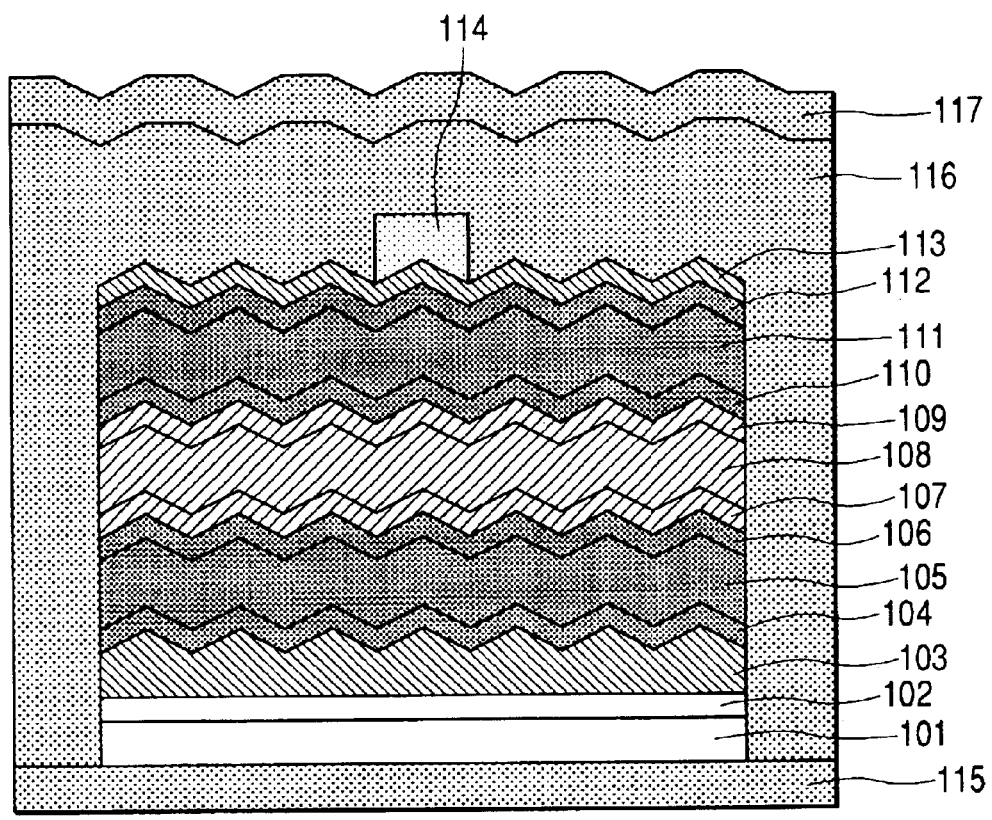
FIG. 1 is a sectional view schematically showing the structure of an example of the photovoltaic element in accordance with the present invention.

The present inventors have extensively pursued studies as to how a photovoltaic element having a high conversion efficiency, less photodegradation, high reliability and producibility with ease should be achieved, and accomplished the following invention that is not easily conceivable from the findings obtained in the past.

The photocurrent utilizable under the sunlight at AM 1.5, increased as a result of the studies made in the past on semiconductor layers, antireflection layers, transparent electrode layers, rear surface reflection layers, has reached 30 mA/cm$^2$ in total. As is known in the prior art, since the connection of pin junctions in a stack of a plurality of pin junctions forming a photovoltaic element can be considered to be a series connection, the voltage of the photovoltaic element is substantially equal to the sum of the voltages of the respective junctions, and the current through the element is generally regulated by the minimum current through the junctions. Therefore, it is generally considered that the most favorable value of the current generated at each junction is close to a value determined by dividing the total photocurrent generally utilizable by the number of pin junctions.

However, the present inventors have found that the performance of a photovoltaic element is not necessarily good when the photocurrents generated at a plurality of pin junctions are accurately equal to each other, and also found that it is not always preferable to make the photocurrent generated at a pin junction of good characteristics smallest as in the methods proposed in the past.

That is, ordinarily, the characteristics of microcrystalline semiconductors are better than those of amorphous semiconductors and the characteristics are improved if the thickness is reduced. However, the inventors of the present invention found that in a case where an amorphous semiconductor and a plurality of microcrystalline semiconductors are stacked and a transparent protective member is provided for protection, a pin junction having its photocurrent increased when the transparent protective member is provided can be provided, and that, in such a case, the method of setting to a smallest value the photocurrent of that pin junction which shows the largest increase in photocurrent by the provision of the transparent protective member is more effective in finally improving the conversion efficiency. The inventors have also found that during long-term use the reduction in the efficiency obtained in this manner is smaller than that in the case of making the photocurrent of a pin junction of good characteristics smallest, and that this is due to the fact that variations in characteristics depending on the film thickness are smaller in the case of microcrystalline semiconductors and the effect of increasing the photocurrent by providing a transparent protective member surpasses the effect based-on selection of the film thickness.

That is, in a case where a first pin junction comprising an i-type amorphous semiconductor, a second pin junction comprising an i-type microcrystalline semiconductor and a third pin junction comprising an i-type microcrystalline semiconductor are provided in this order from a light incidence side, and where at least a transparent protective member and a transparent electrode layer are provided on the light incidence side of the first pin junction, the photocurrent generated at the third pin junction can be increased more largely than the photocurrents generated at the first and the second pin junctions. In this case, the inventors have found it preferable to previously form the junctions such that the photocurrents generated at the first and the second pin junctions are larger than the photocurrent generated at the third pin junction.

Further, the inventors have found it preferable that in a photovoltaic element having a transparent protective member and a transparent electrode layer successively provided from a light incidence side, and a plurality of pin junctions provided subsequently to the transparent electrode layer, of the photocurrents generated at the plurality of pin junctions, the photocurrent generated at the pin junction that shows the maximum increase of photocurrent by the provision of the transparent protective member is the smallest.

Moreover, the inventors have found it preferable that in a photovoltaic element having a transparent protective member and a transparent electrode layer successively provided from a light incidence side, at least one pin junction comprising an i-type amorphous semiconductor provided subsequently to the transparent electrode layer, and at least two pin junctions comprising i-type microcrystalline semiconductors provided subsequently to the i-type amorphous semiconductor, of the photocurrents generated at the plurality of pin junctions, the photocurrent generated at the pin junction comprising the i-type microcrystalline semiconductor closest to the light incidence side is not the smallest and the photocurrent generated at one of the other pin junctions comprising the i-type microcrystalline semiconductors is the smallest.

To fabricate a photovoltaic element in accordance with the present invention, either a single substrate processing system or a roll-to-roll processing system may be used. FIG. 1 schematically shows an example of a cross section of a photovoltaic element having a protective member formed thereon. Before the provision of the protective member, a member forming the photovoltaic element can be continuously fabricated on a belt-like substrate.

Figure 2:
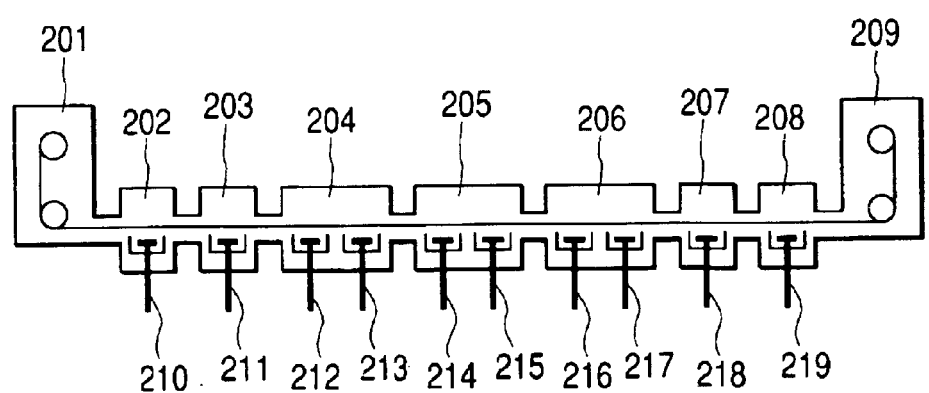
FIG. 2 is a view schematically showing an apparatus suitable for making pin junction layers in accordance with the present invention.

For instance, a reflective layer 102 is formed on a belt-like substrate 101 having a width of 35 cm and a length of 200 m and made of stainless steel by a sputtering apparatus similar to the apparatus shown in FIG. 2 and a transparent resistive layer 103 is formed on the reflective layer 102. The transparent resistive layer 103 is deposited by a sputtering apparatus similar to the apparatus shown in FIG. 2 or an electrodeposition apparatus for deposition from an aqueous solution. It is preferred that the transparent resistive layer 103 has unevenness of several hundred nm, so that it can scatter light to improve the conversion efficiency. Unevenness may be formed by selecting fabrication conditions, or may be formed by increasing surface irregularities by wet etching of a flat surface.

Semiconductor layers are formed on this substrate by the plasma chemical vapor deposition (CVD) apparatus shown in FIG. 2. A supply chamber 201, film forming chambers 202 to 208 and a winding chamber 209 are exhausted to a predetermined pressure by a vacuum pump (not shown). Ceiling plates with temperature controllers are provided in the film forming chambers 202 to 208 and adjust the belt-like substrate to desired temperatures by contact therewith. A gas gate for preventing mixing of gases is provided as needed between each adjacent pair of the film forming chambers. Gas supply paths are provided in cathode electrodes 210 to 219 for supplying high-frequency power to supply gases through holes facing the substrate. For instance, silane, phosphine and hydrogen are supplied as raw material gases to the film forming chamber 202, silane and hydrogen are supplied as raw material gases to the film forming chambers 203 to 207, and silane and diborane are supplied as raw material gases to the film forming chamber 208. Inside the film forming chambers 202 to 208, inner chambers for controlling a glow discharge generation region are provided. The opening of an exhaust valve is adjusted to adjust the pressure in each of the chambers to the predetermined pressure. In this state, the belt-like substrate is transported at a predetermined speed and a high-frequency power is supplied to the electrodes 210 to 219, thereby making n-type amorphous silicon 104 in the film forming chamber 202, i-type microcrystalline silicon 105 in the film forming chambers 203 to 207 and p-type microcrystalline silicon 106 in the film forming chamber 208. Thus, a pin junction (third pin junction) that is closest to the substrate (i.e., located at the substrate-side-most position) and comprises the i-type microcrystalline silicon can be formed. The rolled substrate is taken out from this apparatus and is again mounted in the supply chamber 201. Then, pin junctions layers 107, 108, and 109 for the next pin junction are respectively made in the same order to form an intermediate pin junction (second pin junction) comprising an i-type microcrystalline silicon. For this film formation, the same apparatus or another apparatus similar to the above-described apparatus may be used. Alternatively, the number of film forming chambers may be increased to continuously make the junctions, although the length of the apparatus is increased.

Further, a pin junction (first pin junction) comprising an i-type amorphous silicon to be provided on the light incidence side is completed by an apparatus that is similar to or the same as that shown in FIG. 2. Since the i-type amorphous semiconductor and the i-type microcrystalline semiconductor are made under different conditions, different apparatuses are ordinarily used. Also, in this case, the film-forming chambers may be connected to each other to continuously make the junctions, although the length of the apparatus is increased. Thin intermediate amorphous silicon layers may be provided between the i-type microcrystalline silicon layers 105 and 108 and the doped layers 104, 106, 107, and 109 by using the film forming chambers 203 and 207 in the same process as that for an i-type amorphous silicon layer 111.

When the pin junctions are made as described above, the photocurrent generated at each of the pin junctions can be adjusted by changing the conditions under which the corresponding i-type semiconductor layer 105, 108, or 111 is made, e.g., changing the distance between the substrate and the electrode, changing the material gas concentration and the flow rate, changing the substrate temperature, changing the pressure, changing the ratio of silane and hydrogen, or adjusting the high-frequency power or the number of film forming chambers used. In this way, the photocurrent generated at the pin junction comprising the i-type microcrystalline silicon layer 105 on the substrate side is adjusted so as to be the smallest of the photocurrents generated at the pin junctions.

Various kinds of high-frequency power from microwaves to radiowaves can be used for making of the pin junctions. The pin junctions ordinarily have unevenness in their surfaces as a reflection of the unevenness of the transparent resistive layer. Also, there is a need to increase the thickness of the i-type semiconductor relative to those of the p-type and n-type. Therefore, the film forming speed can be increased if a plurality of film forming chambers such as film forming chambers 203 to 207 are used. Further, the conditions in the chambers may be slightly varied to optimize the film quality.

A transparent electrode layer 113 capable of functioning also as an antireflection film is made on this specimen by using another vacuum apparatus.

The 35 cm wide belt-like specimen is cut into 24 cm long pieces, and end portions of the transparent electrode layers defined by a distance of 2 mm from the edges are processed by electrolytic etching for prevention of short-circuit; a comb-like current-collecting electrode 114 is provided on the surface thereof, lead electrodes are attached, and a steel plate is provided as a rear surface reinforcing member 115. Further, a fluoride polymer thin film provided as a surface film 117 and a thermoplastic transparent organic resin layer provided as a surface-encapsulating member 116 are bonded to form a transparent protective member, thus completing a photovoltaic element.

Figure 3:
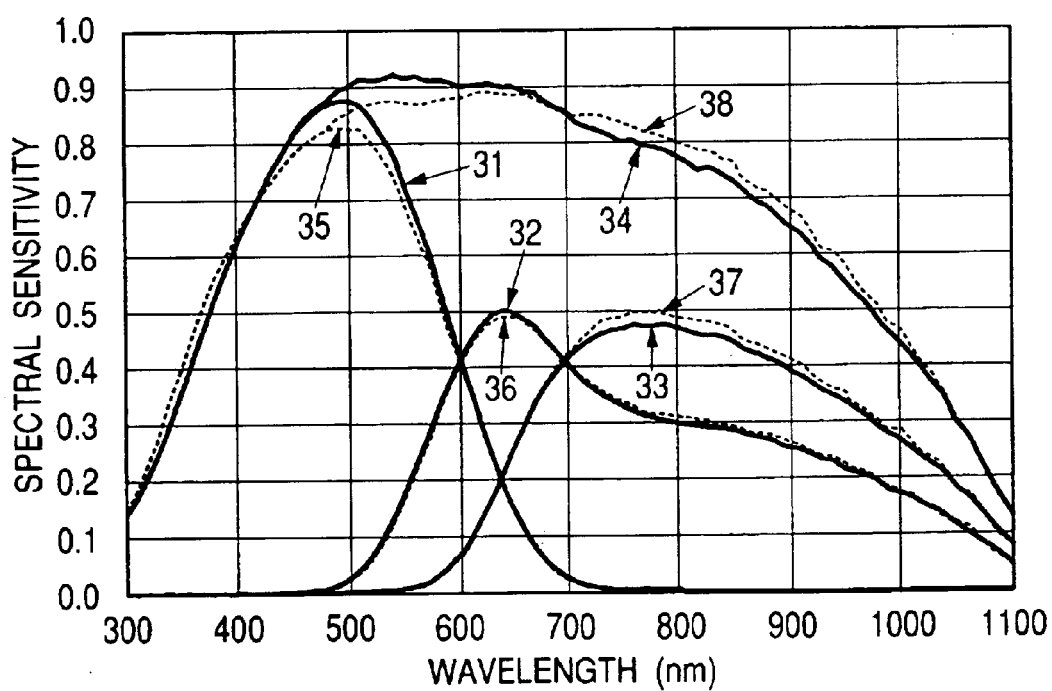
FIG. 3 is a graphical representation showing the spectral sensitivity of a plurality of pin junctions in accordance with the present invention.

FIG. 3 shows the spectral sensitivity of the photovoltaic element before and after the provision of the transparent protective member formed of the above-described surface encapsulating member 116 and surface film 117. In FIG. 3, curve 31 indicates the spectral sensitivity of the first pin junction comprising the i-type amorphous semiconductor before the provision of the transparent protective member; curve 32, the spectral sensitivity of the second pin junction comprising the i-type microcrystalline semiconductor before the provision of the transparent protective member; curve 33, the spectral sensitivity of the third pin junction comprising the i-type microcrystalline semiconductor before the provision of the transparent protective member; and curve 34, the overall spectral sensitivity of the photovoltaic element formed by stacking these three kinds of pin junctions. The photocurrents generated at the first, second and third pin junctions can be computed from the spectral sensitivities and the AM 1.5 solar radiation spectrum in accordance with JIS and were 11.1 mA/cm$^2$, 10.5 mA/cm$^2$, and 9.2 mA/cm$^2$, respectively.

In FIG. 3, curves 35., 36, 37, and 38 respectively indicate the results of measurements made in correspondence with those described above after the provision of the transparent protective member formed of the above-described surface encapsulating member 116 and surface film 117. The photocurrents generated at the pin junctions after the provision of the transparent protective member were 10.5 mA/cm$^2$, 10.4 mA/cm$^2$, and 9.6 mA/cm$^2$. It can be seen that the photocurrent generated at the third pin junction was increased while the photocurrents generated at the first and second pin junctions were reduced.

The spectral sensitivity was measured by using a product YQ-250BX from JASCO Corporation. Measurements with 2.7×2.7 cm monochromatic light were made at central six points in eight sections equally divided in the widthwise direction and at one point in the lengthwise direction on the specimen having a size of 35 cm wide and 24 cm long, and the sensitivity was expressed by the average of the values thereby measured. In this example, substantially no characteristic nonuniformity was exhibited since the photovoltaic element was fabricated by the roll-to-roll process. Incidentally, although it is preferable to reduce the nonuniformity in the widthwise direction as far as possible, it is extremely difficult to make the characteristics uniform entirely over an area including the ends in the widthwise direction. In this example, the nonuniformity of the photocurrent distribution as measured at the central six points in the widthwise direction can be limited to ±0.2 mA/cm$^2$, so that the characteristics at the six central points in the widthwise direction were sufficiently dominant in the characteristics of the entire specimen.

The initial conversion efficiency of the photovoltaic element after the provision of the above-described transparent protective member was 12.6% in total with respect to the 35 cm wide and 24 cm long size. Further, the conversion efficiency after a degradation test (temperature: 45–50° C.; irradiation light energy density: 100 mW/cm$^2$) in accordance with IEC61646, 10.18, which is a generally international standard, was 12.0%.

Table 1 shows the results of changing the photocurrent generated at the second pin junction by adjusting the silane supply rate and high-frequency power during the formation of the i-type microcrystalline semiconductor. Since the third pin junction is made under the same conditions, almost of the light not utilized at the second pin junction is utilized at the third pin junction to increase the photocurrent.

TABLE 1

|  | Photocurrent of first pin junction after provision of protective member (mA/cm$^2$) | Photocurrent of second pin junction after provision of protective member (mA/cm$^2$) | Photocurrent of third pin junction after provision of protective member (mA/cm$^2$) | Initial conversion efficiency (%) | Conversion efficiency after degradation (%) |
|---|---|---|---|---|---|
| Example 1-1 | 10.5 | 10.4 | 9.6 | 12.6 | 12.0 |
| Example 1-2 | 10.5 | 10.2 | 9.8 | 12.5 | 12.0 |
| Example 1-3 | 10.5 | 10.6 | 9.4 | 12.4 | 11.9 |
| Comparative Example 1-1 | 10.5 | 10.0 | 10.0 | 12.3 | 11.7 |
| Comparative Example 1-2 | 10.5 | 9.8 | 10.2 | 12.2 | 11.7 |
| Comparative Example 1-3 | 10.5 | 9.6 | 10.4 | 12.3 | 11.8 |

As can be seen from these examples, the conversion efficiency is improved in the case where the photocurrent generated at the third pin junction is the smallest. The values of the spectral sensitivity shown in FIG. 3 are the results of measurement without applying a bias voltage. However, even when a bias voltage not higher than 1.3 V in the forward direction was applied in the examples, the photocurrent generated at the third pin junction was also the smallest. Needless to say, if the photocurrent generated at the second pin junction is increased to a value larger than those shown above, the photocurrent generated at the third pin junction becomes extremely small and the conversion efficiency is reduced.

Each of the components of the present invention will be described. The present invention is not limited to the examples described below and known fabrication methods can be used for the present invention.

(Substrate 101)

As the substrate 101 functioning as a lower electrode in two electrodes between which the semiconductor layers are interposed, a sheet of a metal or an alloy, a stack of metal or alloy sheets, a carbon sheet on which a reflection layer is formed, a resin film on which an electroconductive layer is formed, for the like can be used. These members can be used in a rolled form and are therefore suitable for continuous fabrication. Further, a crystalline substrate made of silicon or the like or a glass or ceramic plate on which a reflective layer and an electroconductive layer are formed is also usable, depending on the kind of use. The surface of the substrate may be polished or cleaned. However, the substrate may be used as such without such a treatment. A substrate having unevenness in its surface is also usable. If a sheet of a magnetic material such as stainless steel (SUS430) is used, it can be transported while accurately controlling its position with rollers containing magnets therein. In a case where a light transmissive substrate such as a glass substrate is used and a photovoltaic element is fabricated by depositing a transparent electrode layer on the substrate, light can enter the element from the transparent substrate side.

(Reflective Layer 102)

It is not necessary to specially provide the reflective layer 102 if a substrate having a high reflectivity is used. In a case where a stainless steel or carbon sheet is used as substrate 101, a layer of aluminum or silver is formed on the substrate by sputtering or the like.

(Transparent Resistive Layer 103)

The transparent resistive layer 103 can be made by sputtering, vacuum evaporation, chemical vapor deposition, ion plating, ion beam method, ion beam sputtering, or the like. Further, the transparent resistive layer 103 can also be made by electrodeposition or dipping from an aqueous solution containing nitrate groups, acetate groups, ammonia groups or the like and metal ions. It is desirable that the resistive layer has as its characteristic a high degree of transparency for transmission of light to the substrate. It is also desirable that the resistive layer has a suitable resistance for limiting the current flowing via defects in the semiconductor layers. More specifically, it is desirable that the transmittance is 90% or higher and the conductivity is not less than $10^{-8}$ (1/Ωcm) and not more than $10^{-1}$ (1/Ωcm). As the material of the resistive layer, zinc oxide, indium oxide, tin oxide or a material containing those oxides can be used.

Unevenness of several hundred nm can be formed in the surface of the resistive layer by controlling its forming conditions. If the surface is flat, it may be processed by wet etching with an aqueous acetic acid solution or the like to provide unevenness. For instance, in the case of sputtering, unevenness can be increased in such a manner that the substrate temperature is raised, the deposition rate is reduced, and the thickness is increased. In the case of electrodeposition using an aqueous solution, unevenness can be increased in such a manner that the zinc concentration is increased and the thickness is increased.

(N-Type and P-Type Semiconductors)

For making of the pin junctions, a CVD apparatus using electric power from high frequency waves to microwaves, or the like can be used. As material gases used in the vacuum chamber for forming n-type amorphous silicon, $SiH_4$, $PH_3$ and $H_2$ or the like are supplied. Electric power is supplied to the chamber containing such gases to form n-type amorphous silicon layers 104, 107, and 110. Further, each of p-type microcrystalline silicon layers 106, 109, and 112 can be formed by using $SiH_4$, $BF_3$ and $H_2$ or the like. The non-monocrystalline material of this semiconductor layer is not limited to an amorphous or microcrystalline material, and this semiconductor layer can be formed in a nip or pin structure. The number of pin junctions is not limited to three selected in the example of the present invention. It may be larger than three.

A plurality of junctions can be continuously formed by an apparatus in an inline system.

(I-Type Microcrystalline Semiconductor)

Each of layers 105 and 108 shown in FIG. 1 by way of example is an i-type microcrystalline semiconductor. The i-type microcrystalline semiconductor is made by using $SiH_4$ and $H_2$ or the like. It is important to select the hydrogen gas dilution rate. A dilution of 10 to 500 times, more preferably about 300 times is necessary. A good microcrystalline semiconductor has a narrower bandgap and a lower open-circuit voltage of 0.4–0.6 V in comparison with the amorphous semiconductor, but has a certain absorption coefficient with respect to a light having a wavelength of 800–1100 nm and enables efficient utilization of the solar radiation. The microcrystalline semiconductor has a crystal grain diameter of 10–100 nm and has a clearly recognizable columnar structure in contrast with the amorphous semiconductor in which a sectional configuration is apparently uniform. If the microcrystalline semiconductor is made at a low temperature of 100–300° C., good carrier transportability can be obtained and the fill factor when used in the photovoltaic element is improved. The high-frequency power density is also an important factor in microcrystallization, and influences even the deposition rate. Preferably, the high-frequency power density is 0.2 to 5 W/cm². As factors in obtaining a microcrystalline semiconductor uniform through a large area, the interelectrode distance and the pressure are also important. An appropriate value of the interelectrode distance is 3 to 20 mm and a suitable value of the pressure is 200 to 2000 Pa. A high-frequency power at frequencies within the range from 13.56 MHz to 3 GHz can be used.

A favorable value of the thickness of the i-type microcrystalline semiconductor in the second pin junction on the light incidence side is 1–3 μm and, more preferably, 1.5–2.0 μm. A favorable value of the thickness of the i-type microcrystalline semiconductor in the third pin junction is 2–4 μm and, more preferably, 2.5–3.5 μm.

The i-type microcrystalline semiconductor layers 108 and 105 in the second and third pin junctions in the present invention may be basically the same. However, these layers may be formed under different forming conditions. Also, each junction may be made by setting the same conditions through a plurality of film forming chambers. However, the making conditions may be changed to more preferable settings. For instance, when the film on the substrate side is made, the hydrogen dilution rate may be increased. When the film on the light incidence side is made, the hydrogen dilution rate may be reduced. A thin amorphous intermediate layer may be provided between the i-type microcrystalline semiconductor and the n-type semiconductor and between the i-type microcrystalline semiconductor and the p-type semiconductor.

(I-Type Amorphous Semiconductor)

The i-type amorphous semiconductor 111 in the first pin junction can be made by the same process as that for the i-type microcrystalline semiconductor. However, a lower hydrogen gas dilution rate of about 10 times may suffice in the process of making the i-type amorphous semiconductor 111. Also, the i-type amorphous semiconductor 111 may be made at a high-frequency power density of about 0.1 W/cm². The film quality is such that a uniform condition of a sectional configuration can be observed. The i-type amorphous semiconductor has an open-circuit voltage of 0.8–1.1 V and is capable of absorbing a light of a wavelength of not more than 800 nm. A favorable value of the thickness of the i-type amorphous semiconductor layer is 0.1–0.5 μm and, more preferably, 0.2–0.3 μm.

(Antireflection Layer 113)

The antireflection layer 113 also functions as the upper electrode provided on the side of the stack of the above-described semiconductor layers 104 to 112 opposite to the substrate side, and it is preferable that the antireflection layer 133 is low in resistance. The antireflection layer 133 can be made from raw materials such as indium oxide, tin oxide, titanium oxide, zinc oxide or a mixture thereof by vacuum evaporation using resistance heating or electron beam, sputtering, CVD, spraying, dipping, or the like. In order to obtain a good antireflection effect in the case of forming the antireflection layer as a light incidence surface, it is preferable to set the film thickness of the antireflection layer to a value determined by dividing the wavelength of light as a main reflection prevention target by the quadruple of the refractive index of the antireflection film. For instance, if the refractive index is 2 and if the wavelength of light to be transmitted with a least loss is 500 nm, it is desirable to set the film thickness to about 63 nm. The antireflection layer may be formed by stacking materials differing in refractive index.

(Current Collecting Electrode 114)

To collect currents with efficiency, the grid-like current collecting electrode 114 may be provided on the antireflection layer 113. A method for forming the current collecting electrode 114 is, for example, sputtering using a mask pattern, resistance heating, CVD, a method of performing patterning by depositing a metal film on the entire surface and unnecessary portions of the metal film are removed by etching, a method of directly forming a grid electrode pattern by photo-CVD, a method of forming a mask having a negative pattern of a grid electrode pattern and thereafter forming plating, or a method of printing an electroconductive paste.

Output terminals for taking out the electromotive force may be thereafter attached to the substrate 101 and the current collecting electrode 114 as needed.

(Surface Encapsulating Member 116)

The surface encapsulating member 116 is required to cover unevenness of the photovoltaic element with a resin in order to protect the conversion element from a severe external environment including variations in temperature and humidity and shocks and to secure bonding between the surface film and the conversion element. Therefore, as characteristics of the material of the surface encapsulating member 116, weather resistance, adhesion, fillability, heat resistance, low temperature resistance and impact resistance are required. Examples of materials satisfying this requirement are polyolefin resins, such as ethylene-vinyl acetate copolymer (EVA), ethylene-methyl acrylate copolymer (EMA), ethylene-ethyl acrylate copolymer (EEA), and a polyvinyl butyral resin, urethane resins, silicone resins, and fluororesins. Among these resins, EVA are well balanced in physical properties in solar cell use and are therefore used preferably. However, if EVA ordinarily formed is used, it deforms or creeps easily because its thermal deformation temperature is low. It is desirable to improve the heat resistance of EVA by crosslinking. In the case of EVA, crosslinking is ordinarily effected by using an organic peroxide. Crosslinking using an organic peroxide is effected in such a manner that free radicals generated from the organic peroxide extract hydrogen and halogen atoms in the resin to form C—C bonds. As a method for activating an organic peroxide, thermal cracking, redox decomposition, and ion decomposition are known. Ordinarily, thermal cracking is preferably performed. Examples of organic peroxides are hydroperoxide, dialkyl (allyl) peroxide, diacyl peroxide, peroxy ketal, peroxy ester, peroxy carbonate, and ketone peroxide. The amount of an organic peroxide added to the encapsulating resin is 0.5 to 5 parts by weight with respect to 100 parts by weight of the encapsulating resin.

An organic peroxide selected from those described above is used in the encapsulating member 116, and crosslinking and hot press bonding can be effected by performing pressing and heating under vacuum. The heating temperature and heating time can be determined according to the thermal cracking temperature characteristics of the organic peroxide. Ordinarily, heating and pressing are finished at such a temperature and time that 90% progress, more preferably at least 95% progress of thermal cracking is achieved. To check crosslinking of the encapsulating resin, the gel fraction may be measured. In order to prevent deformation of the encapsulating resin at a high temperature, it is desirable to effect crosslinking such that the gel fraction is 70 wt % or more.

To effect the above-described crosslinking reaction with efficiency, triallyl isocyanurate (TAIC) called a crosslinking assistant may be used. Ordinarily, 1 to 5 parts by weight of TAIC is added to 100 parts by weight of the encapsulating resin.

The material of the encapsulating member has high weather resistance. However, for a further improvement in weather resistance or for protection of the layers under the encapsulating member, an ultraviolet light absorber may be used in combination with the material of the encapsulating member. As this ultraviolet light absorber, known compounds are available. Preferably, a low-volatility ultraviolet light absorber is used in consideration of the environments in which solar cell modules are used. Such an ultraviolet light absorber may be selected from various organic compounds, e.g., a salicylic acid compound, a benzophenone compound, benzotriazole compound, and a cyanoacrylate compound.

If a light stabilizer other than the ultraviolet light absorber is simultaneously added, the encapsulating agent becomes more stable to light. Typically, a hindered amine light stabilizer is used. The hindered amine light stabilizer does not absorb ultraviolet rays unlike the ultraviolet light absorber but exhibits a remarkable synergistic effect when used in combination with the ultraviolet light absorber.

It is preferred that the amount of the ultraviolet light absorber and the amount of the light stabilizer added are 0.1–1.0 wt % and 0.05–1.0 wt %, respectively, on the basis of the amount of the encapsulating resin.

Further, an antioxidant may be added in order to improve the heat resistance and thermal processibility. The antioxidant chemical structure may be selected from monophenols, bisphenols, polymer phenols, sulfur compounds and phosphorus compounds. The amount of the antioxidant added is preferably 0.05–1.0 wt % on the basis of the amount of the encapsulating resin.

If the photovoltaic element is supposed to be used under more severe environmental conditions, it is preferable to improve the adhesion between the encapsulating resin and the photovoltaic element or between the encapsulating resin and the surface resin film. It is possible to improve the adhesion by adding a silane coupling agent or an organic titanate compound to the material of the encapsulating member. The amount of the additive is preferably 0.1 to 3 parts by weight., more preferably 0.25 to 1 part by weight with respect to 100 parts by weight of the encapsulating resin.

On the other hand, it is necessary to make the surface-encapsulating member 116 transparent in order to minimize the reduction in the amount of light reaching the photovoltaic element. More specifically, it is desirable to set the transmittance of the surface encapsulating member 116 to 80% or more, more preferably 90% or more in the visible wavelength region from 400 nm to 800 nm. Also, it is preferable to set the refractive index at a temperature of 25° C. to 1.1 to 2.0, more preferably 1.1 to 1.6 in order to enable light to enter more easily from the air. It is also desirable that the transmittance at wavelengths of 300 to 400 nm is 0 to 90%.

(Surface Film 117)

The surface resin film 117 is positioned in an outermost layer of a solar cell module and therefore needs to have performance capabilities for ensuring-long-term reliability during outdoor exposure of the solar cell module, as well as weather resistance, anticontamination properties and mechanical strength. A material preferably used for the surface resin film 117 in the present invention is a fluororesin, an acrylic resin or the like. A fluororesin is used particularly preferably because it is superior in weather resistance and in anticontamination properties. For example, polyvinylidene fluoride resin, polyvinyl fluoride resin, tetrafluoroethylene-ethylene copolymer resin or the like may be used. Polyvinylidene fluoride resin is superior in weather resistance, while tetrafluoroethylene-ethylene copolymer resin is superior in weather resistance-mechanical strength compatibility and in transparency.

It is necessary to set the thickness of the surface resin film 117 to a substantially large value to ensure certain mechanical strength. However, there is a problem in terms of cost with an excessively large thickness. More specifically, the thickness of the surface resin film 117 is preferably within the range from 20 $\mu$m to 200 $\mu$m, more preferably within the range from 30 $\mu$m to 100 $\mu$m.

In order to improve the adhesion between the surface resin film 117 and the encapsulating member 116, it is desirable to perform a surface treatment such as corona discharge treatment, plasma treatment, ozone treatment, ultraviolet-light irradiation, electron beam irradiation or flame treatment on one surface of the surface resin film 117. The corona discharge treatment is used particularly preferably because it can be performed at a high processing rate with a comparatively simple apparatus to largely improve the adhesion.

Unevenness is formed in the surface resin film 117 and the surface-encapsulating member 116. This unevenness may be formed during the cover forming process or may be formed by pressing or the like after the cover forming.

(Rear Surface Reinforcing Member 115)

A cover film which is an example of the rear surface reinforcing member is required to maintain electrical insulation between the electroconductive substrate 101 of the photovoltaic element and the outside. As the material of the cover film, a material capable of ensuring sufficient electrical insulation of the electroconductive substrate 101, having higher long-term durability, resistant to thermal expansion and shrinkage and flexible is preferred. For example, a nylon film or a polyethylene terephthalate film is preferably used.

Another example of the rear surface reinforcing member other than the above-described cover film is, for example, a steel sheet, a plastic plate or a glass fiber reinforced plastic (FRP) plate, which may be used for the purpose of increasing the mechanical strength of a solar cell module or to prevent the solar cell module from being strained or warped due to a temperature change. If this type of rear surface reinforcing member having a large mechanical strength is used, the photovoltaic element of the present invention can be applied to construction materials such as roofing materials.

EXAMPLES

The present invention will be described with respect to examples thereof.

Example 1—1

In this example, as described below in detail, a photovoltaic element constructed as shown in the schematic cross-sectional view of FIG. 1 was made in a roll-to-roll system and a protective member was formed on the photovoltaic element after cutting of the element.

A rolled stainless steel SUS430 sheet having a width of 35 cm, a length of 200 m and a thickness of 0.15 mm and having unevenness ordinarily called a dull finish was used as substrate 101. The substrate was set in a direct-current magnetron sputtering apparatus similar to that shown in FIG. 2. Silver and zinc oxide targets 48 cm wide and 24 cm long in the direction of transport were placed on electrode portions in the sputtering apparatus. The interior of the apparatus was exhausted until the pressure therein became equal to 2 mPa or lower. Thereafter, argon gas was supplied at 30 cc/min to each film-forming chamber and the pressure in the chamber was maintained at 0.3 Pa. The substrate was heated from the rear side to 200° C. while being continuously transported from the supply chamber 201 to the winding chamber 209, and a DC power of 4 kW was applied to from a 800 nm thick silver reflective layer 102 and a 2 $\mu$m thick zinc oxide transparent resistive layer 103. Unevenness of about 300 nm was formed in the surface to enable light to obtain a reflecting and scattering effect enabling effective use of light.

The rolled substrate on which the reflective layer 102 and the transparent resistive layer 103 were formed was set in the supply chamber 201 of the apparatus outlined in FIG. 2, followed by exhaustion to 20 mPa with a vacuum pump. Thereafter, the film-forming chambers were set under the conditions shown in Table 2, the substrate was transported at a speed of 100 mm/min, and a third pin junction (104, 105, 106) comprising an i-type microcrystalline semiconductor was made.

TABLE 2

|  | $SiH_4$ [cc/min] | $PH_3/H_2$ (diluted to 2% with $H_2$) [cc/min] | $BF_3/H_2$ (diluted to 1% with $H_2$) [cc/min] | $H_2$ [cc/min] | High-frequency power [W] |
|---|---|---|---|---|---|
| Film forming chamber 202 | 5 | 10 | 0 | 1000 | 200 |
| Film forming chamber 203 | 12 | 0 | 0 | 5000 | 200 |
| Film forming chambers 204–206 | 150 | 0 | 0 | 4000 | 2000 |
| Film forming chamber 207 | 34 | 0 | 0 | 2500 | 200 |
| Film forming chamber 208 | 20 | 0 | 400 | 15000 | 1600 |

The cathode electrodes 210 to 219 were 50 cm wide and 80 cm long in the direction of transport, and the substrate was supported at a distance of 10 mm from the cathode electrodes. For control of the temperature of the substrate, the temperature of the ceiling plates being in contact with the rear surface of the substrate was controlled to 150° C. The pressure was controlled at 600 Pa by adjusting the opening of the throttle valve. This process enables an n-type amorphous semiconductor layer 104 to be formed in a thickness of 30 nm in the film forming chamber 202, an intermediate layer (not shown) of an i-type amorphous semiconductor to be formed in a thickness of 10 nm in each of the film forming chambers 203 and 207, an i-type microcrystalline semiconductor layer 105 to be formed in a thickness of 3 $\mu$m in the film forming chambers 204 to 206, and a p-type microcrystalline semiconductor layer 106 to be formed in a thickness of 10 nm in the film forming chamber 208.

Subsequently, the rolled substrate was taken out of the winding chamber 209 and again set in the supply chamber 201 of the apparatus shown in FIG. 2. After exhaustion with the vacuum pump, the film-forming chambers were set under the conditions shown in Table 3, the substrate was transported at a speed of 150 mm/min, and a second pin junction (107, 108, 109) comprising an i-type microcrystalline semiconductor was made.

TABLE 3

| | SiH$_4$ [cc/min] | PH$_3$/H$_2$ (diluted to 2% with H$_2$) [cc/min] | BF$_3$/H$_2$ (diluted to 1% with H$_2$) [cc/min] | H$_2$ [cc/min] | High-frequency power [W] |
|---|---|---|---|---|---|
| Film forming chamber 202 | 8 | 50 | 0 | 500 | 200 |
| Film forming chamber 203 | 20 | 0 | 0 | 5000 | 200 |
| Film forming chambers 204–206 | 150 | 0 | 0 | 3500 | 2000 |
| Film forming chamber 207 | 53 | 0 | 0 | 3000 | 200 |
| Film forming chamber 208 | 30 | 0 | 400 | 15000 | 1600 |

For the control of the temperature of the substrate, the temperature of the ceiling plates being in contact with the rear surface of the substrate was controlled to 150° C. The pressure was controlled at 600 Pa by adjusting the opening of the throttle valve. This process enables an n-type amorphous semiconductor layer 107 to be formed in a thickness of 30 nm in the film forming chamber 202, an intermediate layer (not shown) of an i-type amorphous semiconductor to be formed in a thickness of 10 nm in each of the film forming chambers 203 and 207, an i-type microcrystalline semiconductor layer 108 to be formed in a thickness of 1.7 μm in the film forming chambers 204 to 206, and a p-type microcrystalline semiconductor 109 to be formed in a thickness of 10 nm in the film forming chamber 208.

Subsequently, the rolled substrate was taken out of the winding chamber 209 and again set in the supply chamber 201 of the apparatus shown in FIG. 2. After exhaustion with the vacuum pump, the film-forming chambers were set under the conditions shown in Table 4, the substrate was transported at a speed of 380 mm/min, and a first pin junction (110, 111, 112) comprising an i-type amorphous semiconductor was made.

TABLE 4

| | SiH$_4$ [cc/min] | PH$_3$/H$_2$ (diluted to 2% with H$_2$) [cc/min] | BF$_3$/H$_2$ (diluted to 1% with H$_2$) [cc/min] | H$_2$ [cc/min] | High-frequency power [W] |
|---|---|---|---|---|---|
| Film forming chamber 202 | 20 | 50 | 0 | 1000 | 100 |
| Film forming chamber 203 | 50 | 0 | 0 | 3000 | 300 |
| Film forming chambers 204–205 | 550 | 0 | 0 | 3000 | 350 |
| Film forming chamber 207 | 10 | 0 | 0 | 1000 | 1000 |
| Film forming chamber 208 | 10 | 0 | 10 | 5000 | 3000 |

For the control of the temperature of the substrate, the temperature of the ceiling plates being in contact with the rear surface of the substrate was controlled to 200° C. The pressure was controlled at 300 Pa by adjusting the opening of the throttle valve. This process enables an n-type amorphous semiconductor layer 110 to be formed in a thickness of 20 nm in the film forming chamber 202, an intermediate layer (not shown) of an i-type amorphous semiconductor to be formed in a thickness of 10 nm in the film forming chamber 203, an i-type amorphous semiconductor layer 111 to be formed in a thickness of 250 nm in the film forming chambers 204 and 205, an intermediate layer (not shown) of an i-type microcrystalline semiconductor to be formed in a thickness of 10 nm in the film forming chamber 207, and a p-type microcrystalline semiconductor layer 112 to be formed in a thickness of 10 nm in the film forming chamber 208. Incidentally, the film-forming chamber 206 was not used since it was possible to obtain a sufficiently large film thickness only by use of the film-forming chambers 204 and 205.

Subsequently, the substrate was set in a DC magnetron sputtering apparatus similar to that shown in FIG. 2 provided with indium oxide targets containing 3 wt % of tin oxide and having a size of 48 cm in width and 24 cm in length in the direction of transport, and the interior of the apparatus was exhausted until the pressure therein became equal to 2 mPa or lower. Thereafter, argon gas and oxygen gas were supplied at 30 cc/min and at 0.2 cc/min, respectively, to each film forming chamber and the pressure inside the chamber was maintained at 0.3 Pa. The substrate was heated from the rear side to 200° C. while being continuously transported from the supply chamber 201 to the winding chamber 209, and a DC power of 0.5 kW was applied to form a 70 nm thick transparent electrode layer 113.

The rolled specimen made as described above is cut into 24 cm long pieces. Each cut piece of the specimen (cell substrate) was put in an electrolytic solution bath containing an aqueous, sulfuric acid-potassium hydroxide mixture solution (2.0% sulfuric acid, 0.7% potassium hydroxide, 97.3% pure water) in which the pH value was adjusted to 1.2 and which was maintained at ordinary temperature (25° C.), the cell substrate being used as a negative electrode, an electrode facing only a 2 mm wide peripheral portion of the cell substrate being used as a positive electrode, the interelectrode distance being set to 0.5 mm. A positive voltage of 4.2 V was applied for one second to etch the transparent electrode layer 113 only at the 2 mm wide peripheral portion of the cell substrate. This etching was performed for the purpose of preventing short-circuits at the end portion of the cell substrate. Subsequently, the shape of the counter electrode was changed to a uniform one, the cell substrate was used as a positive electrode, and a positive voltage of 4.2 V was applied for 25 ms with the interelectrode distance being set to 40 mm. The application of the voltage in a pulse form was repeated 80 times, thus performing an electrolytic treatment. This treatment was performed for the purpose of etching the transparent electrode layer on short circuit portions formed due to internal defects of the cell substrate. Incidentally, the electrical conductivity of the aqueous, sulfuric acid-potassium hydroxide mixture solution was 70.0 mS/cm (25° C.), and the area of the counter electrode was the same as the substrate area (35 cm×24 cm). The cell substrate was thereafter taken out of the electrolytic solution bath, the electrolytic solution on the cell surfaces was sufficiently washed away by pure water, and the cell substrate was dried for 30 minutes at 150° C. in a warm air oven.

Copper wires coated with carbon were pressure bonded as current-collecting electrode 114 to the cell surface, and an output terminal was attached to the copper wires. Finally, a copper tab was attached as a negative terminal to the stainless steel substrate by using a stainless steel solder. The output terminal provided as a positive terminal was formed in such a manner that a copper foil tape was attached to the current-collecting electrode 114 by an electroconductive adhesive. The positive terminal was extended in a roundabout fashion to the rear side, with an insulating member interposed between the positive terminal and the photovoltaic element, thus enabling an output to be obtained through a hole in a rear surface cover member described below.

An EVA sheet (a product from Springborn Laboratories, Inc., trade name: PHOTOCAP, thickness: 460 μm) and a nonoriented ETFE film (a product from Du Pont, trade name: Tefzel Film, thickness: 50 μm) processed by a corona discharge treatment on one surface were superposed on the light receiving surface of the photoelectric conversion portion (cell substrate). An EVA sheet (a product from Springborn Laboratories, Inc., trade name: PHOTOCAP, thickness: 460 μm), a nylon film (a product from DuPont, trade name: Dartek, thickness: 63.5 μm) and a galvalium steel sheet (galvanized sheet iron, thickness: 0.27 mm) were superposed on the rear surface of the photoelectric conversion portion. These layers were superposed in the order of ETFE/EVA/photoelectric conversion portion/EVA/nylon/EVA/sheet iron. At this time, an aluminum mesh (16×18 meshes, wire diameter: 0.011 inch) was disposed on the outside of the ETFE film via a mold-releasing Teflon film (a product from DuPont, trade name: Teflon PFA film, 50 μm thick) for EVA forced out. This stack was heated for 30 minutes at 150° C. while being pressed and degassed by using a vacuum lamination apparatus, thereby obtaining a photovoltaic element having unevenness formed in its surface by the aluminum mesh. Incidentally, the EVA sheet used in this element is one widely used as a solar cell encapsulating material and formed in such a manner that 1.5 parts by weight of a crosslinking agent, 0.3 part by weight of an ultraviolet light absorber, 0.1 part by weight of a light stabilizer, 0.2 part by weight of an antioxidant and 0.25 part by weight of a silane coupling agent are blended with 100 parts by weight of an EVA resin (having a vinyl acetate content of 33%). The output terminal was extended in advance to the rear side of the photovoltaic element to enable an output to be extracted after lamination through a terminal leadout opening formed in advance in the galvalium sheet iron. A protective resin is bonded to this terminal leadout opening, thus completing the photovoltaic element.

Examples 1-2, 1-3, Comparative Examples 1—1, 1-2, 1-3

Photovoltaic elements were completed by following the same procedure as in Example 1—1 with the exception that the silane supply rate and the high-frequency power during formation of the i-type microcrystalline semiconductor layer of the second pin junction were changed as shown in Table 5. The silane supply rate and the high-frequency power are simultaneously changed because the suitable power also varies when the silane supply rate varies.

The spectral sensitivities of these examples of the present invention and comparative examples before and after the provision of the transparent protective member were measured and the photocurrents generated by the AM 1.5 solar radiation spectrum in accordance with JIS were computed. The results of these measurements and the computation are shown in Table 5 (the results are the same as those shown in Table 1).

The spectral sensitivity was measured by using the product YQ-250BX from JASCO Corporation. Measurements with 2.7 cm×2.7 cm monochromatic light were made at central six points in eight sections equally divided in the widthwise direction and at one point in the lengthwise direction on the specimen having a size of 35 cm in width and 24 cm in length, and the sensitivity was expressed by the average of the values thereby measured. In these examples, substantially no characteristic nonuniformity was exhibited since the photovoltaic element was fabricated by the roll-to-roll process. It is preferable to reduce the nonuniformity in the widthwise direction but it is extremely difficult to make the characteristics uniform entirely over all the area including the end portions in the widthwise direction. In these examples, the nonuniformity of the photocurrent distribution as measured at the central six points in the widthwise direction can be limited to ±0.2 MA/cm$^2$. The characteristics at the six central points in the widthwise direction were sufficiently dominant in the characteristics of the entire specimen.

The initial conversion efficiency of the photovoltaic element after the provision of the above-described transparent protective member is shown as a value representing the measurement results corresponding to the entire size 35 cm wide and 24 cm long. The conversion efficiency after a degradation test (temperature: 45–50° C., irradiation light energy density: 100 mW/cm$^2$) in accordance with IEC61646, 10.18, which is a generally international standard, is also shown in Table 5.

TABLE 5

|  | SiH$_4$ for second i-layer (cc/min) | High-frequency power for second i-layer (W) | Photocurrent of first pin junction before/after provision of protective member (mA/cm$^2$) | Photocurrent of second pin junction before/after provision of protective member (mA/cm$^2$) | Photocurrent of third pin junction before/after provision of protective member (mA/cm$^2$) | Initial conversion efficiency (%) | Conversion efficiency after degradation (%) |
|---|---|---|---|---|---|---|---|
| Example 1-1 | 150 | 2000 | 11.1/10.5 | 10.5/10.4 | 9.2/9.6 | 12.6 | 12.0 |
| Example 1-2 | 145 | 2000 | 11.1/10.5 | 10.3/10.2 | 9.4/9.8 | 12.5 | 12.0 |
| Example 1-3 | 155 | 2000 | 11.1/10.5 | 10.5/10.6 | 9.1/9.4 | 12.4 | 11.9 |
| Comparative Example 1-1 | 140 | 1900 | 11.1/10.5 | 10.0/10.0 | 9.7/10.0 | 12.3 | 11.7 |
| Comparative Example 1-2 | 135 | 1900 | 11.1/10.5 | 9.8/9.8 | 9.9/10.2 | 12.2 | 11.7 |
| Comparative Example 1-3 | 130 | 1900 | 11.1/10.5 | 9.6/9.6 | 10.1/10.4 | 12.3 | 11.8 |

It can be seen from the results shown in Table 5 that the photovoltaic elements of the example of the present invention in which the photocurrent of the third pin junction is the smallest have conversion efficiencies higher than those of the photovoltaic elements of the comparative examples. It can also be seen that the photovoltaic elements of the examples of the present invention in which the photocurrent generated at that pin junction showing the largest increase of photocurrent by the provision of the transparent protective member is the smallest have conversion efficiencies higher than those of the photovoltaic elements of the comparative examples.

Examples 2-1, 2—2, Comparative Examples 2-1, 2—2, 2-3

Photovoltaic elements were completed following the same procedure as in Example 1–1 with the exception that the transporting speed during formation of the i-type microcrystalline semiconductor layer of the second pin junction was changed as shown in Table 6.

The spectral sensitivities of the examples of the present Invention and the comparative examples before and after the provision of the transparent protective member were measured and the photocurrents generated by the AM 1.5 solar radiation spectrum in accordance with JIS were computed in the same manner as mentioned above. The results of the measurements and the computation are shown in Table 6. Further, the conversion efficiencies at an initial stage and after a degradation test, measured in the above-described manner, are also shown in Table 6.

TABLE 6

| | Transporting speed (mm/min) | Photocurrent of first pin junction before/after provision of protective member (mA/cm$^2$) | Photocurrent of second pin junction before/after provision of protective member (mA/cm$^2$) | Photocurrent of third pin junction before/after provision of protective member (mA/cm$^2$) | Initial conversion efficiency (%) | Conversion efficiency after degradation (%) |
|---|---|---|---|---|---|---|
| Example 1-1 | 150 | 11.1/10.5 | 10.5/10.4 | 9.2/9.6 | 12.6 | 12.0 |
| Example 2-1 | 153 | 11.1/10.5 | 10.2/10.2 | 9.5/9.8 | 12.4 | 11.9 |
| Example 2-2 | 146 | 11.1/10.5 | 10.7/10.6 | 9.1/9.4 | 12.4 | 11.9 |
| Comparative Example 2-1 | 156 | 11.1/10.5 | 9.9/10.0 | 9.7/10.0 | 12.2 | 11.7 |
| Comparative Example 2-2 | 159 | 11.1/10.5 | 9.7/9.8 | 9.9/10.2 | 12.2 | 11.7 |
| Comparative Example 2-3 | 162 | 11.1/10.5 | 9.5/9.6 | 10.1/10.4 | 12.1 | 11.6 |

When the transporting speed during formation of the i-type microcrystalline semiconductor layer was changed, the thicknesses of the n-type semiconductor layer and the p-type semiconductor layer were also changed, which influence was however very small as is seen from the results shown in Table 6, and the results were good in the case where the photocurrent of the third pin junction was the smallest. Also, the results were good in the case where the photocurrent generated at that pin junction showing the largest increase of photocurrent by the provision of the transparent protective member was the smallest.

In the case where the photovoltaic element of the present invention is made, the photoelectric conversion efficiency in the final product form is improved. Also, variations in characteristics during use over a long time period are small and the reliability is high.

Further, the difference between the characteristics when pin junctions are made and the characteristics after working for forming a roofing material has been performed is small, so that designing and schedule control become easier.

What is claimed is:

1. A photovoltaic element comprising a first pin junction comprising an i-type amorphous semiconductor, a second pin junction comprising an i-type microcrystalline semiconductor, and a third pin junction comprising an i-type microcrystalline semiconductor provided in the mentioned order from a light incidence side of the photovoltaic element, wherein at least a transparent protective member and a transparent electrode layer are provided on a light incidence side of the first pin junction, and wherein the photocurrent generated at the third pin junction is smaller than the photocurrents generated at the first and the second pin junctions by at least 0.4 mA/cm$^2$.

2. The photovoltaic element according to claim 1, wherein the open-circuit voltage of the first pin junction is within the range from 0.8 V to 1.1 V; the open-circuit voltages of the second and the third pin junctions are within the range from 0.4 V to 0.6 V; and the thickness of the i-type layer of the second pin junction is greater than 1.0 μm.

3. A photovoltaic element comprising a first pin junction comprising an i-type amorphous semiconductor, a second pin junction comprising an i-type microcrystalline semiconductor, and a third pin junction comprising an i-type microcrystalline semiconductor provided in the mentioned order from a light incidence side of the photovoltaic element, wherein at least a transparent protective member and a transparent electrode layer are provided on a light incidence side of the first pin junction, and wherein of the photocurrents generated at the plurality of pin junctions, the photocurrent generated at the third pin junction is the smallest, and wherein the open-circuit voltage of the first pin junction is within the range from 0.8 V to 1.1 V; the open-circuit voltages of the second and the third pin junctions are within the range from 0.4 V to 0.6 V; and the thickness of the i-type layer of the second pin junction is greater than 1.5 μm.

4. The photovoltaic element according to claim 1, wherein before the transparent protective member is provided, the photocurrent generated at the first pin junction is the largest and the photocurrent generated at the second pin junction is the second largest.

5. The photovoltaic element according to claim 1, wherein the photocurrent generated at the third pin junction shows the largest photocurrent increase by the provision of the transparent protective member.

* * * * *